(12) United States Patent
Kulidjian et al.

(10) Patent No.: US 6,385,022 B1
(45) Date of Patent: May 7, 2002

(54) METHOD AND APPARATUS FOR DERIVING POWER SYSTEM DATA FROM CONFIGURABLE SOURCE POINTS

(75) Inventors: Ara Kulidjian, Toronto; Jeff Mazereeuw, Newmarket, both of (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/324,664

(22) Filed: Jun. 3, 1999

(51) Int. Cl.[7] ............................................... H02H 3/00
(52) U.S. Cl. ............................. 361/62; 361/80; 361/97
(58) Field of Search ............................. 361/80, 88, 90, 361/93.1, 62, 97, 63, 65, 93.2; 702/64

(56) References Cited

U.S. PATENT DOCUMENTS

| | | | |
|---|---|---|---|
| 4,870,531 A | 9/1989 | Danek | 361/93 |
| 4,937,757 A | 6/1990 | Dougherty | 364/492 |
| 5,185,705 A | 2/1993 | Farrington | 364/483 |
| 5,220,479 A | 6/1993 | Fraisse | 361/97 |
| 5,224,011 A * | 6/1993 | Yalla et al. | 361/93 |
| 5,627,718 A * | 5/1997 | Engel et al. | 361/97 |
| 5,809,045 A | 9/1998 | Adamiak et al. | |
| 5,828,576 A | 10/1998 | Loucks et al. | |

FOREIGN PATENT DOCUMENTS

| | | | |
|---|---|---|---|
| EP | 0 222 688 | 10/1986 | H01H/71/74 |

OTHER PUBLICATIONS

Mills, David L., "Internet Time Synchronization: The Network Time Protocol", IEEE Transactions on Communications, US, IEEE Inc., New York, vol. 39, No. 10, Oct. 1, 1991, pp. 1482–1493, XP000275311, ISSN: 0090–6778.

* cited by examiner

Primary Examiner—Josie Ballato
Assistant Examiner—Robert L. DeBeradinis
(74) Attorney, Agent, or Firm—Hunton & Williams

(57) ABSTRACT

A protective relay that derives and processes power system data from multiple user-configurable data source points. Data from multiple source points can be combined in the relay as a single source of data useful to perform a wide variety of monitoring and protection tasks. Multiple digital signal processing modules can be used to provide additional processing resources, including the ability to provide protection and revenue-class metering in a single device.

21 Claims, 10 Drawing Sheets

|  | A | B | C | D | E |
|---|---|---|---|---|---|
| CHANNEL 1 | CT | CT | VT | CT | VT |
| CHANNEL 2 | CT | CT | VT | CT | VT |
| CHANNEL 3 | CT | CT | VT | CT | VT |
| CHANNEL 4 | CT | CT | VT | CT | VT |
| CHANNEL 5 | VT | CT | VT | --- | --- |
| CHANNEL 6 | VT | CT | VT | --- | --- |
| CHANNEL 7 | VT | CT | VT | --- | --- |
| CHANNEL 8 | VT | CT | VT | --- | --- |

| PHASE CT F1 | PHASE CT F1 PRIMARY: 100 A | RANGE: 1 TO 50000 IN STEPS OF 1 A |
|---|---|---|
|  | PHASE CT F1 SECONDARY: 5 A | RANGE: 1 A, 5 A |
| GROUND CT F4 | GROUND CT F4 PRIMARY: 100 A | RANGE: 1 TO 50000 IN STEPS OF 1 A |
|  | GROUND CT F4 SECONDARY: 5 A | RANGE: 1 A, 5 A |
| PHASE VT F5 | PHASE VT F5 CONNECTION: Wye | RANGE: WYE, DELTA |
|  | PHASE VT F5 NOMINAL SEC: 120.0 V | RANGE: 50.0 TO 240.0 IN STEPS OF 0.1 V |
|  | PHASE VT F5 RATIO: 120.0 | RANGE: 0.1 TO 24000.0 IN STEPS OF 0.1 |
| AUXILIARY VT F8 | AUXILIARY VT F8 CONNECTION: Vag | RANGE: Vn, Vag, Vbg, Vcg, Vab, Vbc, Vca |
|  | AUXILIARY VT F8 NOMINAL SEC: 120.0 V | RANGE: 50.0 TO 240.0 IN STEPS OF 0.1 V |
|  | AUXILIARY VT F8 RATIO: 120.0 | RANGE: 0.1 TO 24000.0 IN STEPS OF 0.1 |

| SOURCE 1 | SOURCE 1 NAME: SRC 1 | RANGE: UP TO 6 ALPHA-NUMERIC CHARACTERS |
|---|---|---|
|  | SOURCE 1 PHASE CT: F1 | RANGE: NONE, F1, F5, F1+F5, ..., F1+F5+M1+M5+U1+U5 (ONLY PHASE CURRENT INPUTS WILL BE DISPLAYED) |
|  | SOURCE 1 GROUND CT: F4 | RANGE: NONE, F4, F8, F4+F8, ..., F4+F8+M4+M8+U4+U8 (ONLY GROUND CURRENT INPUTS WILL BE DISPLAYED) |
|  | SOURCE 1 PHASE VT: F5 | RANGE: NONE, F1, F5, ..., U5 (ONLY PHASE VOLTAGE INPUTS WILL BE DISPLAYED) |
|  | SOURCE 1 AUX VT: F8 | RANGE: NONE, F4, F8, ..., U8 (ONLY AUXILIARY VOLTAGE INPUTS WILL BE DISPLAYED) |

FIG. 7

METHOD AND APPARATUS FOR DERIVING POWER SYSTEM DATA FROM CONFIGURABLE SOURCE POINTS

FIELD OF THE INVENTION

The present invention relates to systems for distributing electrical power. More particularly, the present invention relates to methods and systems for monitoring, protecting and controlling an electrical power distribution network.

BACKGROUND OF THE INVENTION

It is important to monitor, provide protection, and control systems which distribute electrical power, and many techniques have been used to provide these functions.

Referring now to FIG. 1, a conventional group of protective functions applied to a power transformer and two circuit breakers arranged in a breaker-and-a-half system configuration is shown. The protection scheme includes, current transformers 14, 16, and 18, and voltage transformer 20. It should be appreciated that FIG. 1 is a single line representation of a three-phase system. The scheme of FIG. 1 thus provides the following available alternating current (AC) values: three-phase currents (from each set of current transformers 14, 16, and 18), and three-phase voltage (from voltage transformer 20). FIG. 1 further includes indications of desired protection and metering, including 50BF (instantaneous overcurrent) breaker failure protection for the breakers at points 24 and 26, 87T (current differential) transformer protection across main transformer 22 (represented as 28), 50P (instantaneous phase overcurrent) transformer protection at point 30, and a measurement of Watts at point 32.

FIG. 2 shows a conventional relay application for achieving the desired protection and metering goals of FIG. 1. The relay application includes first and second 50BF protective relays 34 and 36, which receive inputs from current transformers 14 and 16, respectively, and which provide outputs to a summing means 38. The 50BF protective relays provide the desired breaker failure protection. There is also provided a multifunction transformer protection relay 40, which receives inputs from the external summing means 38, current transformer 18, and a voltage transformer 20. The external summing means 38 outputs a summation of the AC current values derived from the transformers 14 and 16.

The transformer differential relay 40 receives voltage data from the voltage transformer 20 via voltage sensor 42, receives summed current values from the external summing means 38 via current sensor 44, and receives current values from the current transformer 18 via current sensor 46. As shown in FIG. 2, the transformer differential relay 40 provides the desired power metering by processing the voltage received at voltage sensor 42 with the summed current values from the external summing means 38. Further, the transformer protection relay provides the desired phase instantaneous overcurrent protection based on the summed current values from the external summing means 38, and provides the desired transformer differential protection based on both the summed current values from the external summing means 38 via current sensor 44 as well as from the current transformer 18 via current sensor 46. The transformer protection relay 40 typically includes a single digital signal processor to perform necessary calculations and provide protective control functions. It should be noted that by summing power system data in an external summing means, the relay is unable to determine the individual components of the summed data values.

U.S. Pat. No. 5,224,011 discloses a multifunction protective relay system which implements a dual processing architecture, using a first digital signal processor (DSP) to execute signal processing algorithms, and using a separate digital signal processor for input/output data processing. A dual-ported random access memory (RAM) is used to allow the separate DSPs to communicate with each other. The protective relay selectively trips and closes a circuit breaker at a generator or cogenerator site, or at a site which connects it to an electric utility system.

U.S. Pat. No. 5,828,576 discloses a power monitoring apparatus and method with an object oriented structure. Individual monitoring devices are used, each of which receives an electrical signal and generates a digital signal representing the electrical signal. Objects within each device include functional modules and registers, which contain inputs, outputs, and setup information for the modules. The function and configuration of each individual monitoring device can be changed. At least one module within the device receives the digital signal as an input and uses the signal to generate measured parameters, and additional modules can generate further parameters from the measured parameters.

While it is typically desirable to perform metering in a power distribution system, conventional protective relays do not adequately perform this function. The dynamic range requirement for protection at 0 to 20–50 times rated current input (typically 1A or 5A) results in a reduction of accuracy from the instrument transformer in the normal metering range at 0 to 1.5–2 times rated current input. The wide dynamic range also results in reduced accuracy and resolution for the measuring device sub-system (e.g., microprocessor, analog/digital converter, and associated analog conditioning circuitry). While certain protective relay devices can provide relatively accurate metering through current transformer inputs, in practice these inputs are typically connected to relaying class current transformers to ensure that the relay provides adequate protection. Relaying class current transformers typically have an accuracy of approximately 5–10%.

It follows from the above that it would be desirable to be able to derive power system data from many points on a power distribution system in a single relay, and it would be further desirable if the points from which the power system data could be derived were configurable by a user. Further, it would be desirable to be able to provide revenue-class metering in a protective relay to simplify installation and system integration, and to provide a protective relay user the ability to easily perform revenue class metering to verify the accuracy of utility company charges. Conventional protective relays do not adequately provide these capabilities.

SUMMARY OF THE INVENTION

The present invention overcomes the above-noted deficiencies, and achieves additional advantages, by providing for, in an exemplary embodiment, a protective relay device with multiple digital signal processors which receive configuration commands via a user interface. The configuration commands define source points in a power distribution system from which electrical parameters can be derived. The derived data can be combined within the relay, allowing for a wide variety of measured parameters and protection capabilities within a single device. Further, the use of multiple digital signal processors allows the protective relay to perform revenue class metering, in addition to the protection functions, by implementing a different dynamic range.

According to an exemplary method of the present invention, data can be derived from a power distribution system by the steps of: configuring a protective relay, through a protective relay interface, to receive system data from a plurality of source points; sensing system parameters at the source points; and performing network monitoring and control in the protective relay based on the sensed system parameters. The data can be combined within the protective relay to provide a wide variety of protective control options. Further, the dynamic measurement range for a given source point may be modified, allowing the protective relay to perform revenue-class metering from one source in addition to protective functions from another source.

BRIEF DESCRIPTION OF THE DRAWINGS

The present invention will be more fully understood upon reading the following Detailed Description in conjunction with the accompanying drawings, in which like reference indicia designate like elements, and in which:

FIG. 5 is a diagram showing exemplary types of digital signal processing modules suitable for use with the present invention;

FIG. 6 is a conceptual diagram of an exemplary method for defining a configurable source point according to an aspect of the present invention; and FIG. 7 is a conceptual diagram showing the defining of other aspects of a configurable source point.

DETAILED DESCRIPTION OF PREFERRED EMBODIMENTS

In the application of protective relays to various elements (e.g., transformers, lines, feeders, generators, etc.) of a power system, it is often necessary to sum several current signals from different current transformers to obtain the net ac current signal flowing into the element to be protected. According to one aspect of the present invention, the sum of certain current signals can be defined by a user as a source. In this context, source refers to a logical grouping of current and/or voltage signals such that one source contains all of the signals required to define the load or fault at a particular point on the power system. Thus, a source might contain one or more of the following types of signals: three-phase currents, single-phase ground current, three-phase voltages, and an auxiliary voltage. According to one aspect of the present invention, all of the signals which make up a source can be provided to a single relay, which performs appropriate grouping, ratio correction, summation, and other processing internally according to configuration settings provided by a user. By using internal combination and processing of source signal data, rather than external summation, individual signals are still available to the relay. The availability of individual signals allows the relay to perform additional calculations (such as calculating a restraint current), or to perform additional protective features which are based on individual currents.

Figure 1:
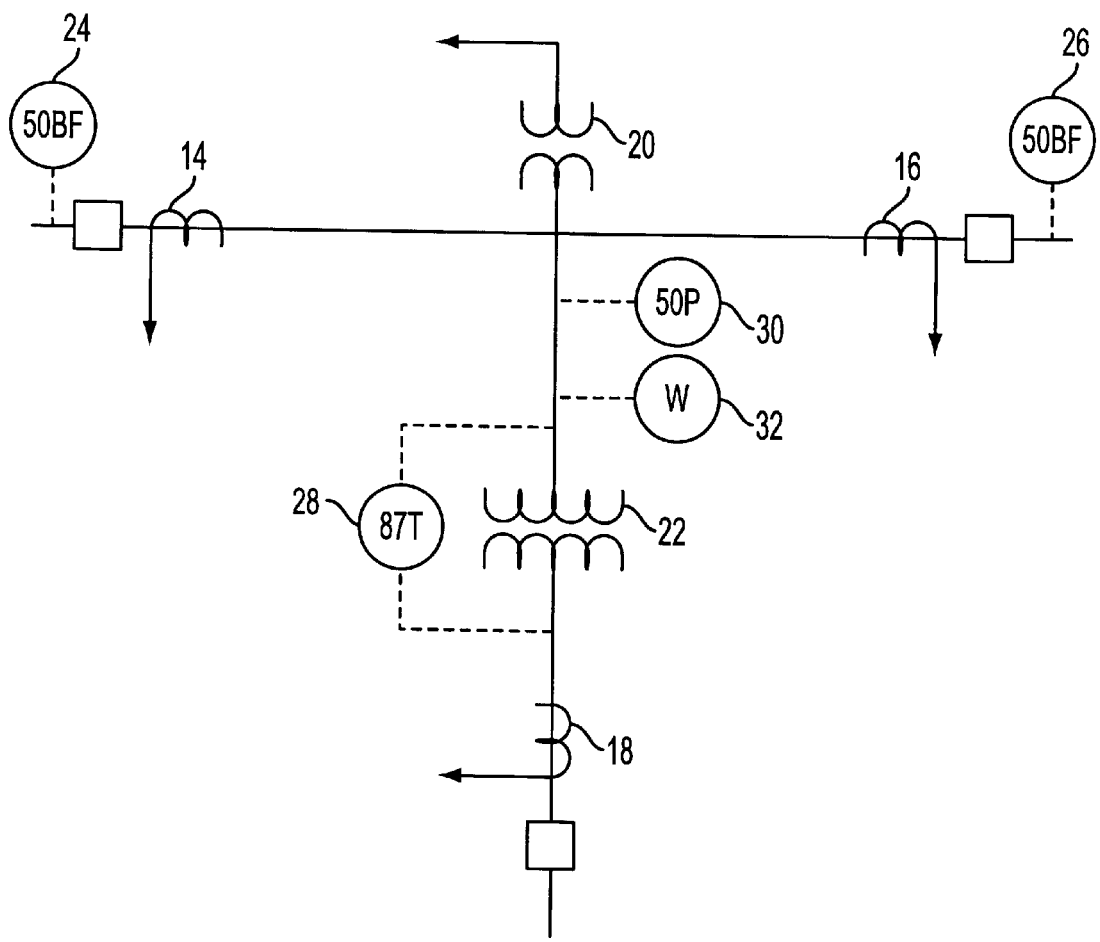
FIG. 1 is a diagram of a conventional power system protection scheme.
Figure 2:
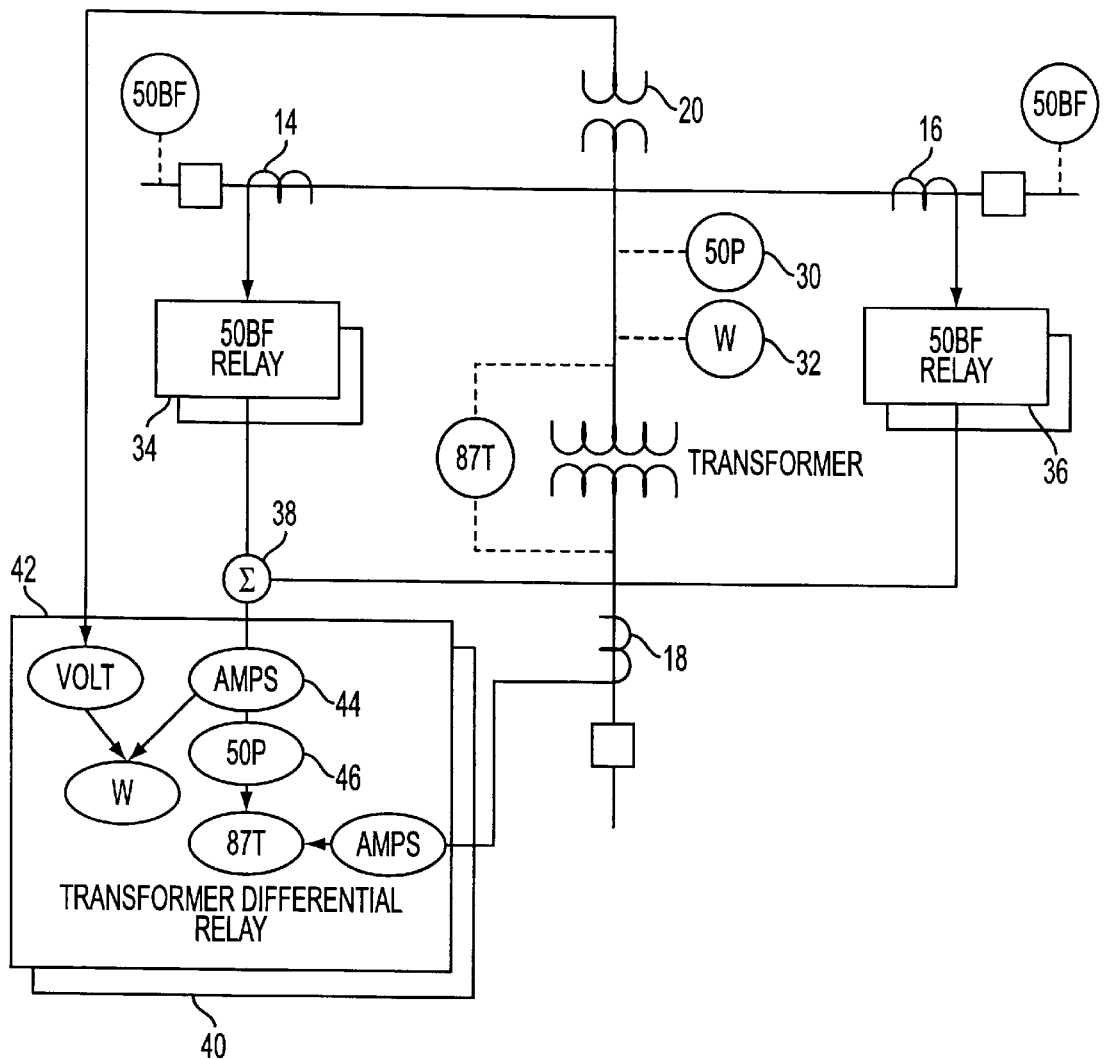
FIG. 2 is a diagram of one implementation of providing desired protection for the scheme of FIG. 1.
Figure 3:
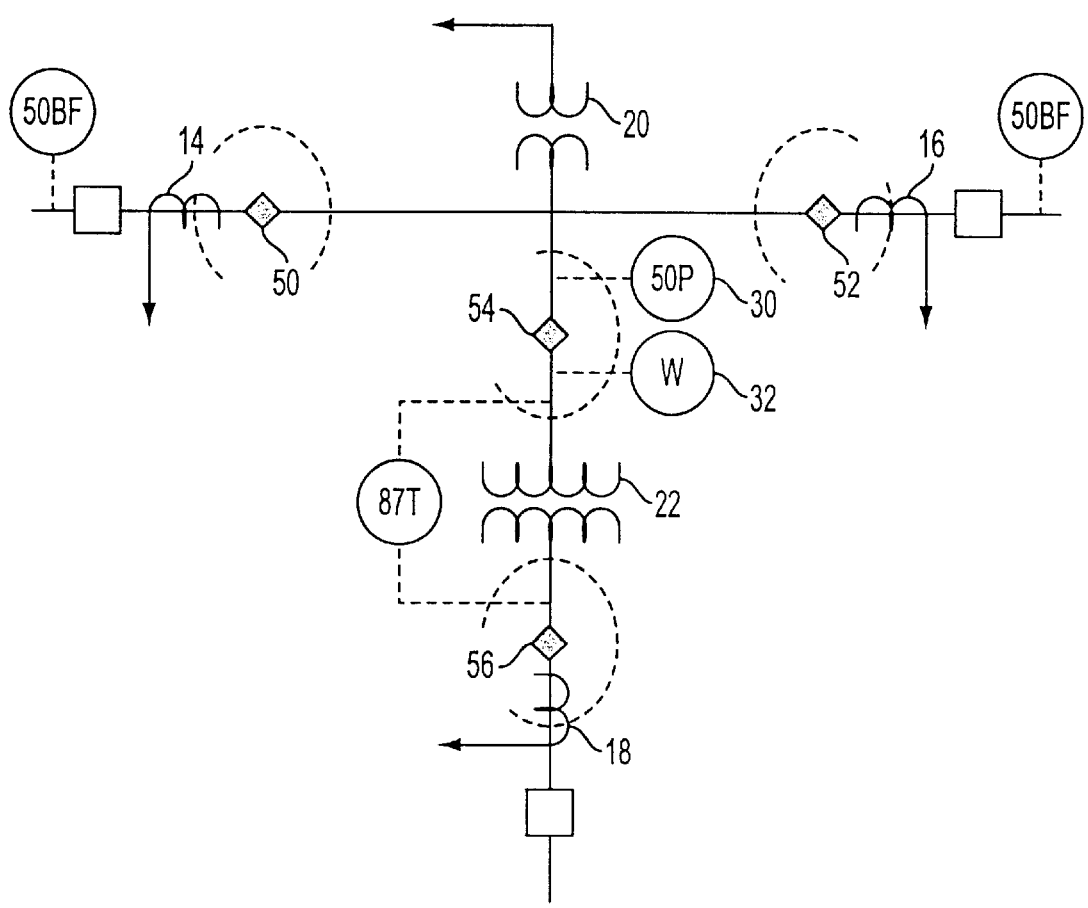
FIG. 3 is a diagram of a power system protection scheme according to one embodiment of the present invention.

Referring now to FIG. 3, an arrangement for deriving power system data from configurable source points according to one embodiment of the present invention is shown. The arrangement, and the desired protection and metering, is similar to the arrangement shown in FIGS. 1–2; however, according to one aspect of the present invention, a plurality of configurable source points are defined by a system user. As described above, each configurable source point can be defined as a point on the power system from which it is desired to derive certain power system data, such as current values, voltage values, power data, frequency values, harmonics, total harmonic distortion, or any other data useful for monitoring or providing protective control in a power system. In the example shown in FIG. 3, user-configurable source point 50 is based on current transformer 14 and voltage transformer 20, user-configurable source point 52 is based on current transformer 16 and voltage transformer 20, user-configurable source point 54 is based on current transformers 14 and 16, as well as on voltage transformer 20, and user-configurable source point 56 is based on current transformer 18. The manner in which the user-configurable source points can be defined by the user will be explained in more detail below.

Figure 4:
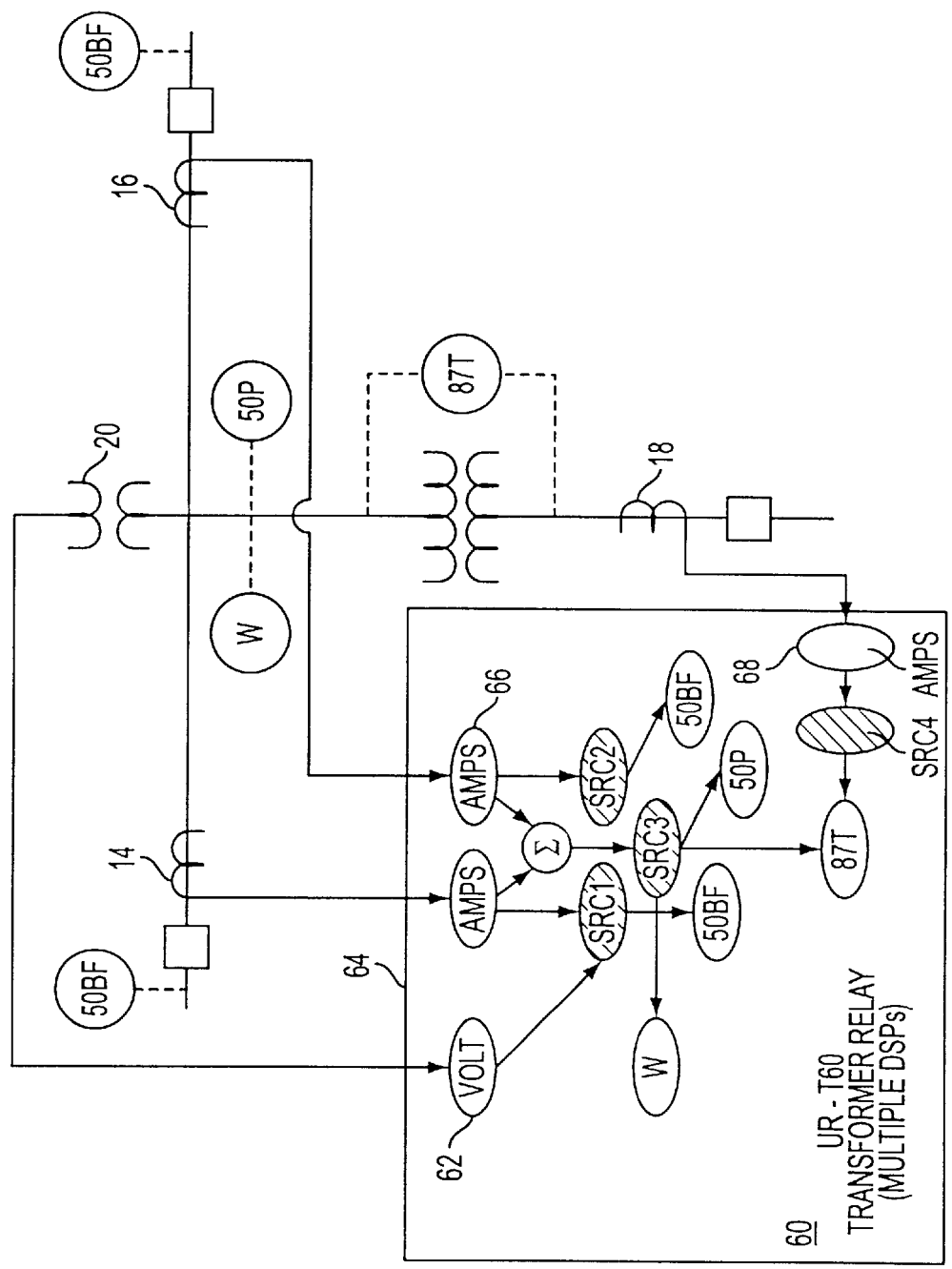
FIG. 4 is a diagram showing how a relay according to the present invention can provide the protection scheme of FIG. 3.

FIG. 4 shows an application of a protective relay, according to an aspect of the present invention, for providing the protection and metering desired in the arrangement of FIG. 3. In the relay 60, there is a voltage sensor 62 for receiving voltage values from the voltage transformer 20, and three current sensors 64, 66, and 68 for receiving current values from current transformers 14, 16, and 18, respectively. The relay 60 includes processing circuitry suitable to perform an internal summation of the current data from current transformers 14 and 16 to generate the data for the user-configurable source point 54, and this data is combined with the voltage values from voltage transformer 20 to perform the desired power metering. The summed current data for the user-configurable source point 54 is also used to perform the desired 50P protection, and is combined with the current data from current transformer 18 (user-configurable source point 56) to perform the desired 87T transformer protection. The current data from current transformers 14 and 16 (user-configurable source points 50 and 52, respectively) are used by the processing resources of the relay 60 to provide the desired 50BF breaker failure protection. It should be appreciated that the implementation of the invention shown in FIG. 4 achieves numerous advantages over the conventional implementation of FIG. 2. For example, in the implementation shown in FIG. 4, a single device (relay 60) performs transformer and breaker failure protection. Further, the implementation of FIG. 4 avoids external summation of current data, thus allowing the relay 60 to use individual system data values, as well as their combinations. Still further, any point on the power system can be configured as a data source for use in metering and protection, as will now be described in more detail.

According to one embodiment of the present invention, the relay 60 includes at least two digital signal processor modules, each of which is typically limited to eight inputs due to limitations on packaging and processing resources. Each digital signal processor module includes a bank of channels, each bank consisting of four consecutive channels (e.g., 1–4 or 5–8). In this embodiment, each bank is used to process data from current transformers, voltage transformers, or is left empty. According to one embodiment of the present invention, the multiple digital signal processing modules are connected by a dedicated peer-to-peer communications bus, and each DSP is further in communication with a central processing unit (CPU) of the relay 60, which provides an interface to a user. According to another embodiment of the present invention, the different relays are in communication with each other over a communications network, allowing the benefits of the present invention to be applied to a protective relay network.

Referring now to FIG. 5, a conceptual rendering of various DSP module configurations 70, 72, 74, 76, and 78 is shown. In module 70, channels 1–4 are assigned for current transformer data, and channels 5–8 are assigned for voltage transformer data. In the example of FIG. 4, channels 1–3 can be used for the three phases of the current transformer data from current transformer 14 (user-configurable data source point 50), and channel 4 can be used as a ground or auxiliary channel for additional current transformer data. A similar channel use scheme can be implemented for the four voltage transformer channels in module 70, and for each bank of DSP channels in the other modules. Module 72 assigns all channels as current transformer channels, module 74 assigns all channels as voltage transformer modules, and modules 76 and 78 each have only one bank of used modules, module 76 using its four channels as current transformer channels, and module 78 using its four channels as voltage transformer modules. In the exemplary configurations of FIG. 5, virtually any possible hardware configuration, to achieve virtually any desired combination of user-configurable sources, can be accommodated. For example, three DSP modules, one each of module 72, module 70, and module 78, can be used for a three-winding transformer, or for a two-winding transformer, where one of the windings has a breaker-and-a-half arrangement. It should be appreciated that many applications may require less than, or more than, three DSP modules.

The auxiliary channel can be used, for example to collect data from a current transformer in a power transformer neutral-to-ground connection. This information can be used to provide protection for ground fault events. An auxiliary voltage input channel can be used to provide a voltage for use in a synchronism-checking scheme. One way of defining the user-configurable sources will now be explained with reference to FIG. 6. The current and voltage inputs can be programmed by selecting various settings through a user interface in the relay 60 itself, or through a user interface of a computer in communication with the relay 60. In this example, each DSP module containing channels numbered 1–8 is assigned a slot indicator (e.g., "F"). The eight channels are then grouped into four sets that are then defined as F1, F4, F5 and F8. Set F1 consists of channels 1, 2 and 3. Set F4 consists of channel 4. Set F5 consists of channels 5, 6 and 7. Set F8 consists of channel 8. As shown in FIG. 6, each channel set (e.g., F1, F4, F5, F8) can have parameters (e.g., primary and secondary current values, connection types, voltage values, ratios, etc.) assigned within various ranges. The parameters and ranges shown in FIG. 6 are exemplary only.

Referring now to FIG. 7, a source can be configured by assigning a name (e.g., source 1), a phase current transformer input (e.g., F1), a ground current transformer input (e.g., F4), a phase voltage transformer input (e.g., F5), and an auxiliary input (e.g., F8). It will be appreciated that is also possible to define a source as the sum of any combination of current transformers.

It should be further appreciated that different values can be selected or displayed via the relay or a communications network associated with the relay. For example, calculated quantities associated with actual current inputs can be displayed with phasor quantities. Further, calculated quantities associated with each configured source, including all quantities related to the source (such as phase currents and voltages, neutral current, sequence quantities, power, energy, frequency, harmonic content), can also be displayed. Configurations required for various elements, such as phase time overcurrent elements, underfrequency elements, synchronization-checking elements, transformer differential, etc. are considered to be within the skill of the art and are therefore not presented here.

According to a further aspect of the present invention, the inclusion of multiple DSPs in a single protective relay can achieve additional significant advantages, including the achievement of revenue-class metering in a protective relay.

In particular, the relay 60 can be provided with dedicated inputs to connect to revenue-class current transformers for metering, in addition to inputs for connection to protection-class current transformers for protection. Thus, a single protective relay can be used for all three-phase applications (feeder, line, transformer, motor, generator, etc.) and can provide accurate metering and proper protection in a single device. Since the voltage transformer dynamic range is the same for metering and protection, one set of inputs can be used for both.

To provide revenue-class metering in a protective relay, one of the multiple DSP modules in the relay 60 can be provided with a set of three current transformer input submodules with a dynamic range suitable for metering (e.g., approximately 0 to 1.5–2 times the rated input). The appropriate dynamic range can be implemented, for example, using a higher burden, or by using an appropriate interposing current transformer. Additional circuitry remains substantially the same for the relay 60. The user-configurable source points of the relay 60 can then be used to select the reduced dynamic range input for revenue-class metering, and the standard wider range input for protection applications. In this manner, revenue class metering and protection can be provided in a single device.

Figure 8:
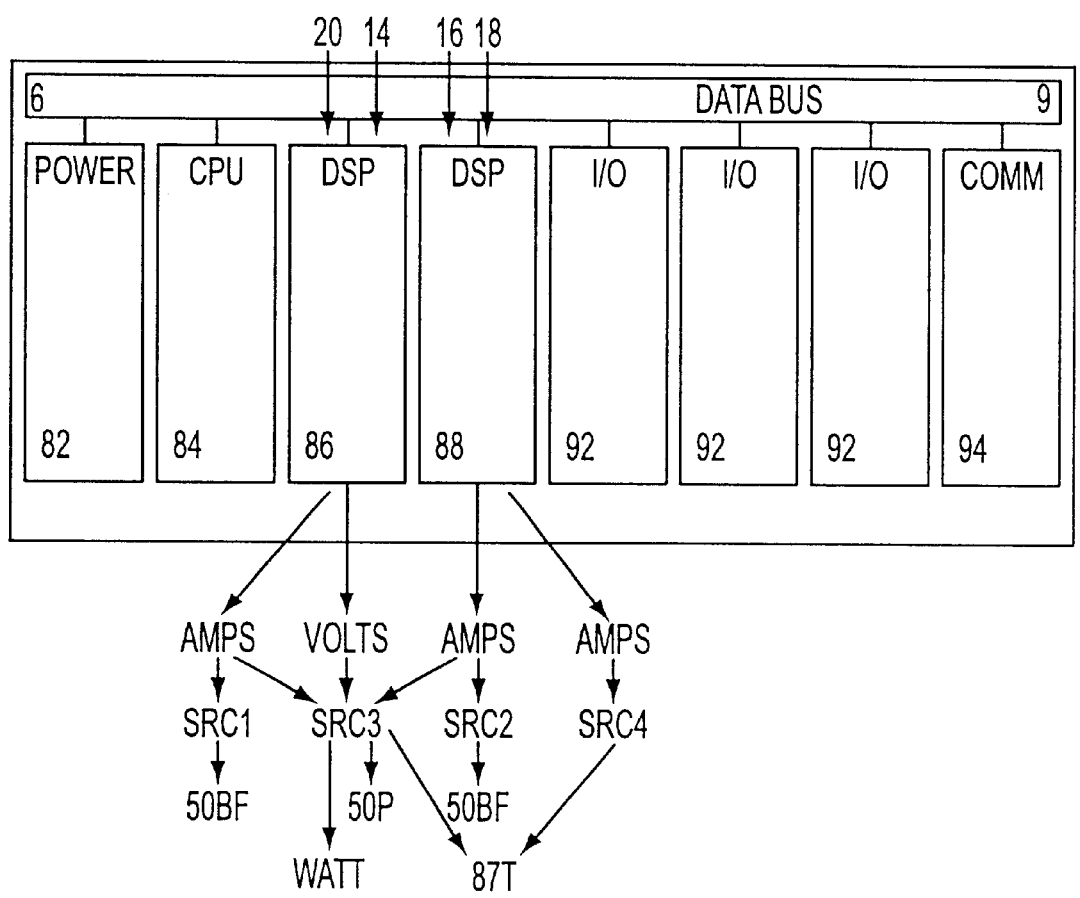
FIG. 8 is a modular implementation of FIG. 4.

FIG. 8 shows an example of a modular implementation of the arrangement of FIG. 4. In FIG. 8, a relay 60 includes a plurality of modules, including a power supply module 82, a central processing unit (CPU) 84, digital signal processing (DSP) modules 86 and 88, digital input/output (I/O) modules 92, and a communications module 94. The CPU 84 is the main processor for the relay, DSPs 86 and 88 provide the signal processing suitable for implementing the protection scheme, the I/O modules 92 exchange inputs and outputs relating to status and control information, and the communications module 94 supports communication using communications formats such as Ethernet, HDLC and UART. In this example, each module is operatively connected with a high-speed data bus 96 that provides communication between the modules. In the implementation of FIG. 8, voltage transformer 20 (see FIG. 4) and current transformer 14 are associated with DSP module 86, current transformers 16 and 18 are associated with DSP module 88. The modular implementation of FIG. 8 thus is suitable to support the protection scheme of FIG. 4 in a single relay.

It should be further appreciated that, while the exemplary embodiments above have been described with respect to a breaker-and-a-half transformer protection scheme, the present invention is not limited to such a protection scheme. Indeed, the benefits of the present invention can be applied to achieve line protection, bus protection, or other types of electrical power system monitoring and control. To achieve certain types of protection such as line protection, it may be desirable to synchronize power system data, particularly from remote sources. Such synchronization can be achieved using known techniques. One such technique is described in Mills, "Internet Time Synchronization: The Network Time Protocol," *IEEE Transactions on Communications*, vol. 39, no. Oct. 10, 1991, pages 1482–93 (a so-called "ping-pong" technique which uses round-trip time tag messages to synchronize clocks which calculate the communications delays. Another technique is described in U.S. Pat. No. 5,809,045 to Adamiak et al., entitled "Digital Current Differential System", which uses information in the measured currents from two or three transmission lines, and digital communication.

Figure 9:
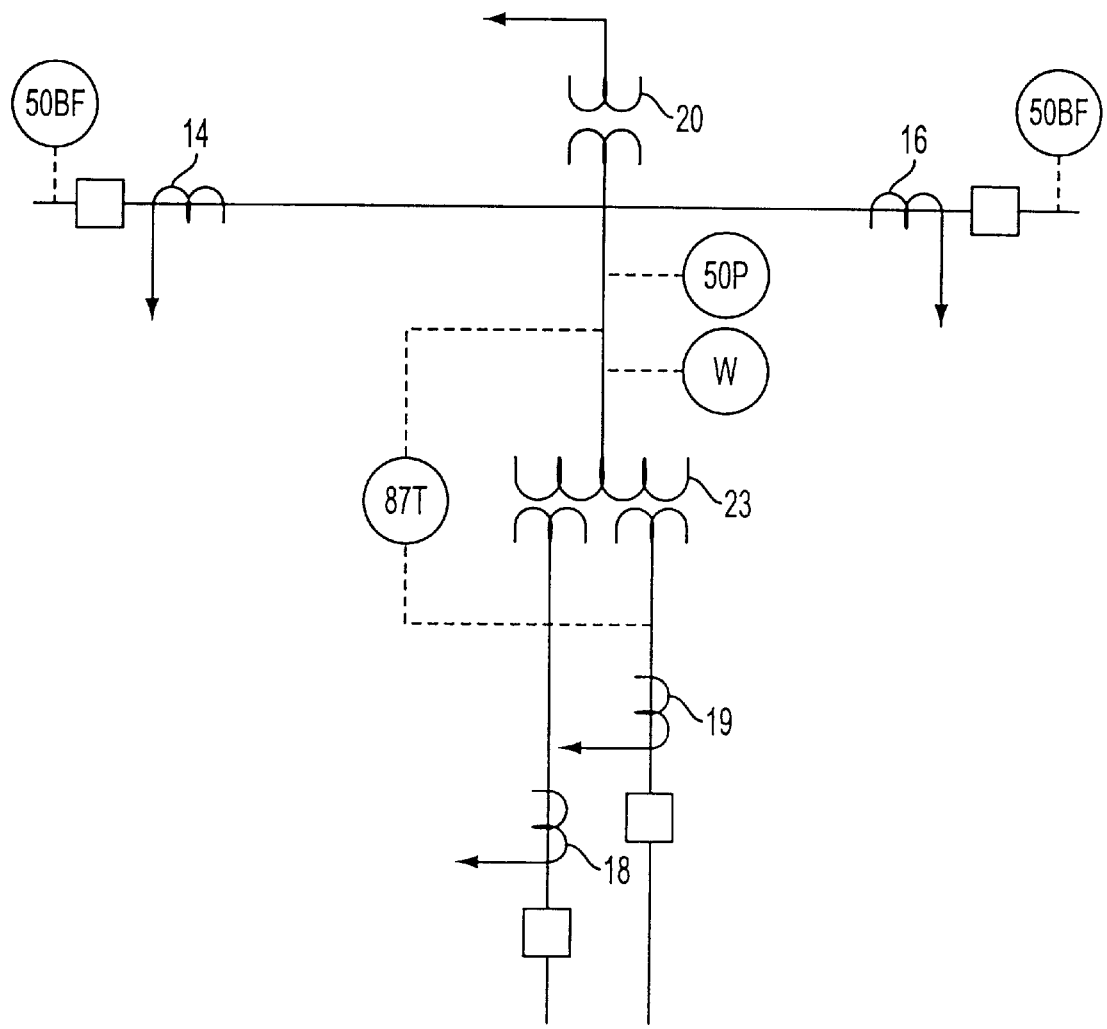
FIG. 9 is a breaker-and-half scheme with a three-winding transformer.

Additional implementations of the present invention will now be described. FIG. 9 shows a breaker-and-a-half scheme which includes a three-winding transformer 23, which replaces the transformer 22 of FIGS. 1–4. Further, the three-winding transformer 23 feeds two separate lines, one for current transformer 18 and another for current transformer 19. Otherwise, the scheme of FIG. 9 is substantially similar to the schemes shown in FIGS. 1–4.

Figure 10:
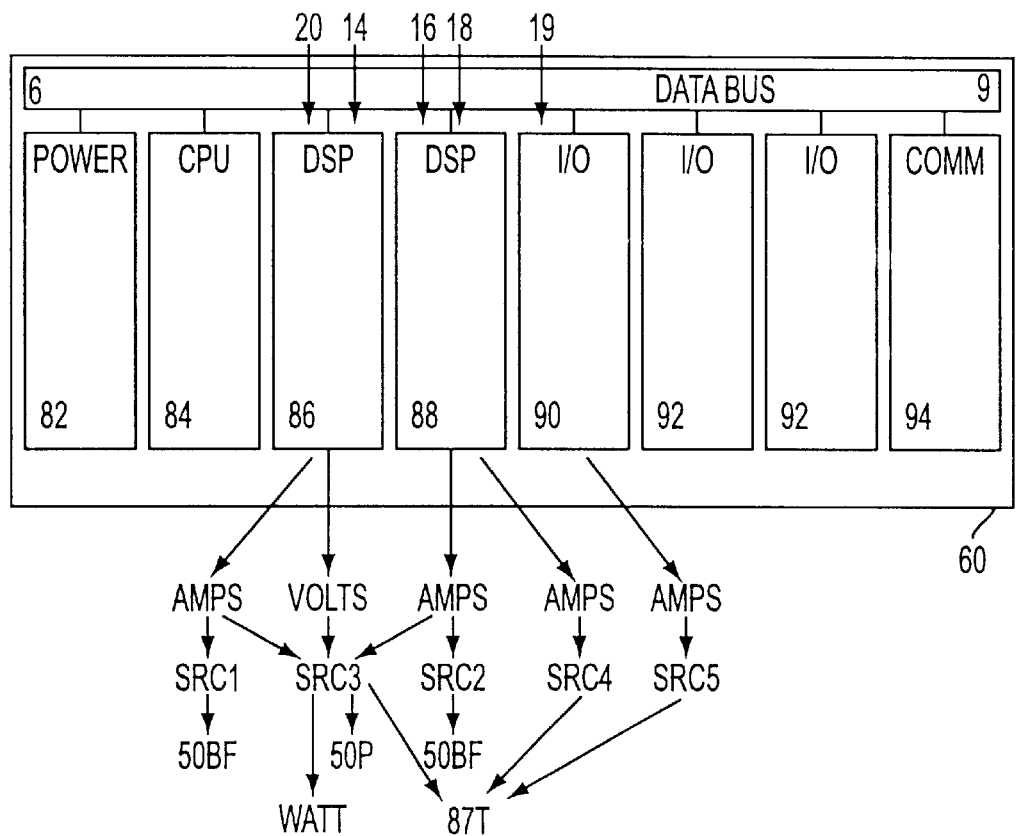
FIG. 10 is a modular architecture solution to implement single relay protection.

FIG. 10 shows a modular architecture solution to implement protection in the scheme of FIG. 9 in a single relay. In the relay 60 of FIG. 10, an additional DSP module 90 has replaced one of the digital I/O modules 92 of FIG. 8. In this implementation, the current transformer 19 is associated with the additional DSP 90, and the current data from transformer 19 is used as an additional input to provide transformer protection for the three-winding transformer 23.

Figure 11:
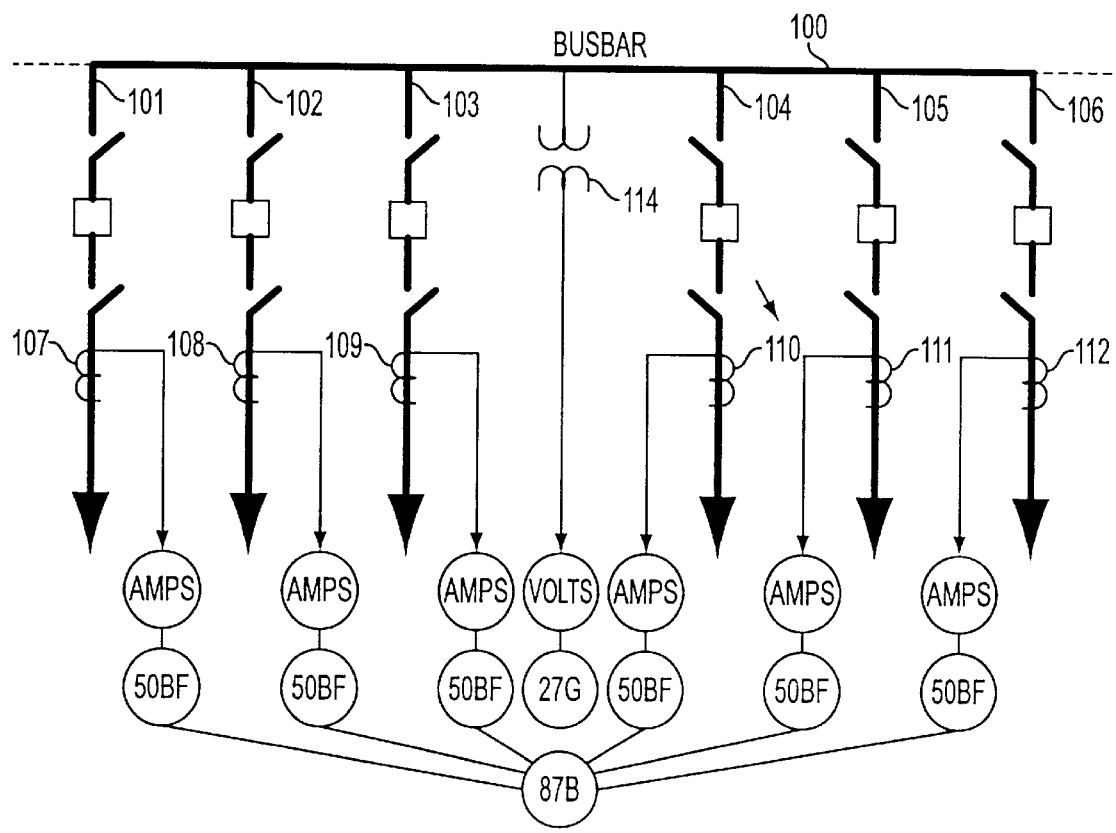
FIG. 11 is an exemplary implementation for busbar protection.

FIG. 11 shows an exemplary implementation for providing busbar protection in a 6-feeder section of a busbar. In the implementation shown in FIG. 11, a portion of a busbar 100 is shown as having six feeders 101–106. Each feeder is associated with a current transformer 107–112. The portion of the busbar 100 is further shown as having a voltage transformer 114. In the implementation shown in FIG. 11, the current transformers 107–112 are configured as source points, and provide current measurements to a relay 60. Also, the voltage transformer 114 is configured as a source point, and provide voltage measurements to the relay 60. These voltage and current measurements are used by the relay 60 to implement protective control, including instantaneous overcurrent breaker failure protection (50BF), differential bus protection (87B), and undervoltage protection (27G).

Figure 12:
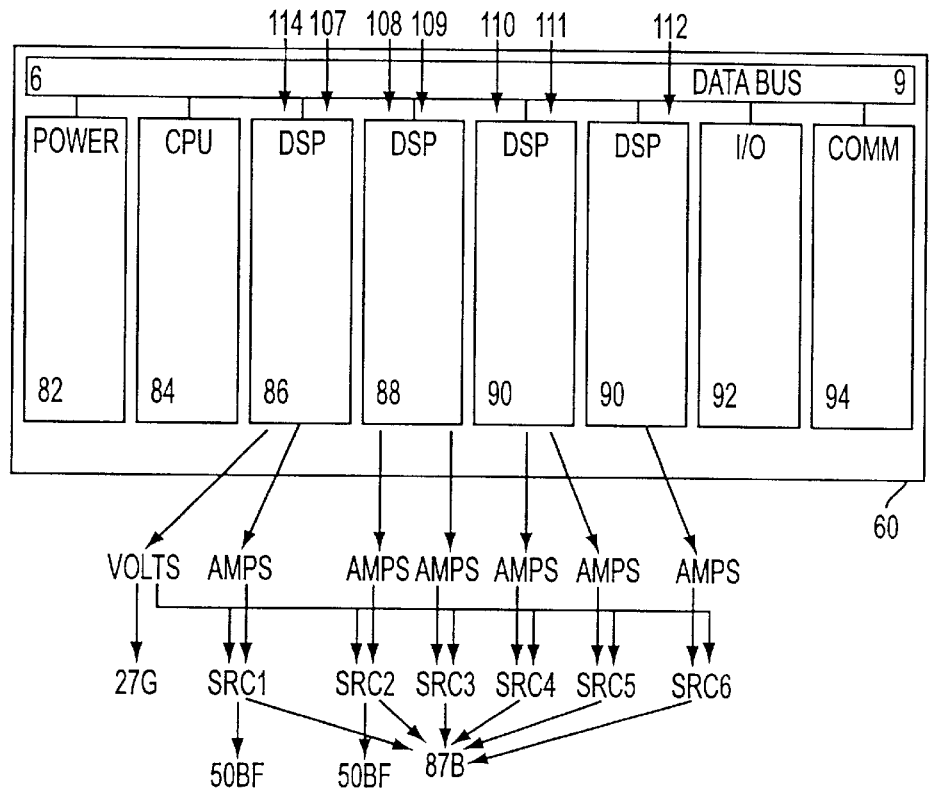
FIG. 12 is a modular architecture solution to implement busbar protection.

FIG. 12 shows a modular architecture solution to implement the busbar protection scheme of FIG. 11. In FIG. 12, the relay 60 is configured substantially similar to that shown in FIG. 10, but the relay in FIG. 12 receives inputs from sources 114 and 107 in a first DSP module, receives inputs from sources 108 and 109 in a second DSP module, receives inputs from sources 110 and 111 in a third DSP module, and receives input from source 112 in a fourth DSP module. The relay 60 processes the information as shown and performs bus differential protection 87B based on the data used to provide breaker failure protection 50BF for the current transformers 107–112.

Figure 13:
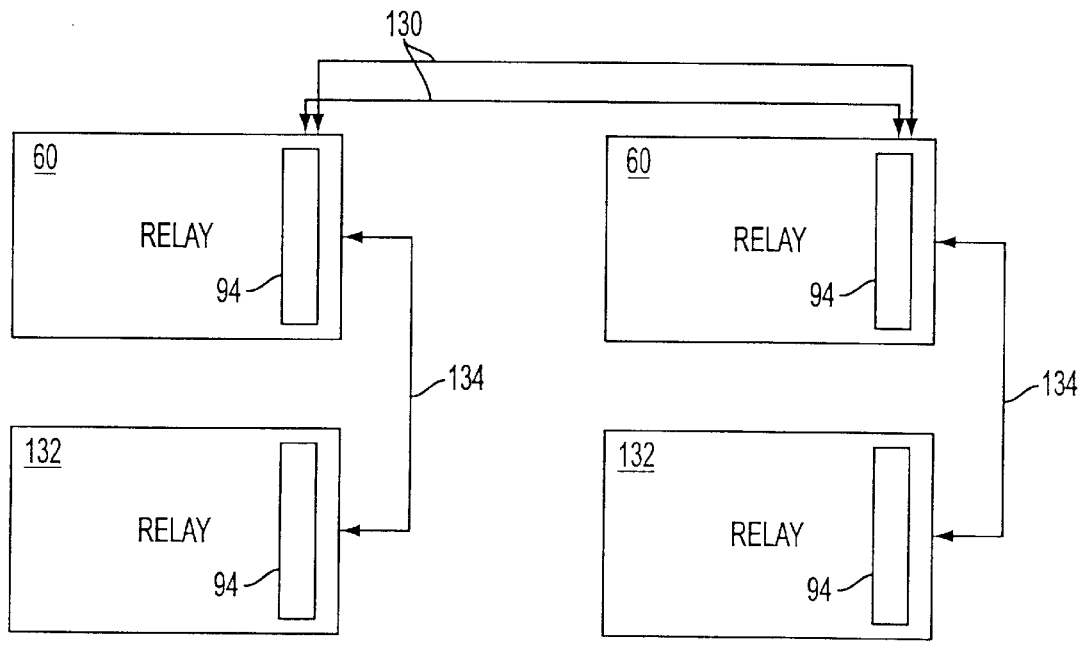
FIG. 13 is a modular distributed architecture solution for 12-feeder busbar protection.3.

FIG. 13 shows a modular distributed architecture solution for providing 12-feeder busbar protection according to one aspect of the present invention. In this implementation, first and second relays 60 connected substantially as shown in FIG. 12, and the first and second relays communicate over a communications link 130, which can be a 10 megabits per second (Mbps) Ethernet connection between the communications modules of the relays 60. Of course, it will be appreciated that other suitable connections can be used. Further, in the implementation of FIG. 13, each of the relays 60 communicates with one of remote relays 132 over communications links 134, which can be a 115 kilobit per second (Kbps) RS485 connection, or other suitable connection.

It should be apparent from the foregoing description that the present invention allows sources to be configured by a user for input to a relay or other intelligent electronic device (IED), and thereby can provide greatly increased protection schemes. Once a source is configured, the metering, protection, or control features of the relay (typically hard-coded in the relay) can use a source as an input quantity. Thus, any source that includes three-phase voltage and three-phase current will automatically be capable of providing power metering for that source. A protective element might have six time-overcurrent elements (TOCs) which can be used to protect six points on the power system, or three TOC elements can be assigned to protect two points on the power system, or two TOC elements can be assigned to protect three points on the power system, or the TOC elements can otherwise be suitably distributed. Further, oscillography can also be configured to measure raw data or derived data from a given source. The present invention allows these and other advantages to be achieved.

While the foregoing description includes numerous details and specificities, it is to be understood that these are provided for purposes of explanation only, and are not intended to limit the scope of the invention. Those of ordinary skill in the art will easily be able to make numerous modifications to the exemplary embodiments described above without departing from the scope of the invention, as defined by the following claims and their legal equivalents.

What is claimed is:

1. A method for deriving data in a power distribution system, comprising the steps of:

configuring a protective relay, through a protective relay interface, to receive system data from a plurality of source points;

sensing system parameter levels at the source points; and performing network monitoring and control in the protective relay based on the sensed system parameter levels, wherein the step of configuring includes the step of defining at least one source point and parameters associated with the at least one source point.

2. The method of claim 1, wherein the protective relay includes a plurality of digital signal processors.

3. The method of claim 1, further comprising the step of communicating system parameter levels to a remote protective relay device over a communications network.

4. The method of claim 1, wherein one of the parameters associated with the at least one source point is dynamic range.

5. The method of claim 4, wherein the dynamic range is defined to provide revenue-class metering.

6. The method of claim 4, wherein the dynamic range is less than approximately 1.5 to 2.0 times the rated input.

7. The method of claim 1, wherein each source point is defined based on one or more of current transformers and voltage transformers associated with the power distribution system.

8. The method of claim 1, further comprising the step of summing multiple system parameter levels in the protective relay.

9. A protective relay, comprising:
at least one central processing unit, the central processing unit connected so as to receive input from a user, and to provide protective control output to a power system;
at least two digital signal processing units connected to the central processing unit by a data bus, each digital signal processing unit receiving power system data from multiple user-defined source points, and combining the power system data from the multiple user-defined source points,
wherein the at least one central processing unit provides protective control output based on the combined power system data.

10. A protective relay for monitoring a power distribution network, comprising:
an interface element connected to receive configuration commands from a user, the configuration commands defining a plurality of source points on the power distribution network;
a plurality of digital signal processing units within the protective relay, the digital signal processing units arranged to receive the configuration commands from the user interface and to execute the configuration commands to monitor network parameters at the plurality of source points.

11. The protective relay of claim 10, wherein the plurality of digital signal processors combines power system data from two or more of the plurality of source points.

12. The protective relay of claim 10, wherein the protective relay performs protection for a power system element in the power distribution network based on the network parameters monitored by the digital signal processing units.

13. The protective relay of claim 10, wherein the protective relay monitors circuit breaker failure based on the network parameters monitored by the digital signal processing units.

14. The protective relay of claim 10, wherein each digital signal processor includes a plurality of channel banks, each channel bank storing processing data corresponding to current transformers or voltage transformers in the power distribution network.

15. The protective relay of claim 10, wherein the interface is provided through a central processing unit.

16. The protective relay of claim 10, wherein at least one of the plurality of digital signal processors processes data from one or more source points within a dynamic range to perform revenue-class metering.

17. The protective relay of claim 16, wherein the dynamic range is less than approximately 1.5–2.0 times the rated input.

18. The protective relay of claim 10, wherein the plurality of digital signal processing units communicate with one another over a dedicated communications bus.

19. The protective relay of claim 18, wherein each of the plurality of digital signal processing units communicate with a central processing unit.

20. The protective relay of claim 19, wherein the central processing unit communicates with a remote central processing unit of a remote protective relay over a communications network.

21. A method for processing power system data in a protective relay associated with the power system, comprising the steps of: receiving power system data from multiple user-defined source points on the power system;
combining the power system data from the multiple user-defined source points in the protective relay; and
providing protective control based on the combined power system data.

* * * * *